United States Patent
Sreeramaneni

(10) Patent No.: US 10,964,708 B2
(45) Date of Patent: Mar. 30, 2021

(54) FUSE-ARRAY ELEMENT

(71) Applicant: Micron Technology, Inc., Boise, ID (US)

(72) Inventor: Raghukiran Sreeramaneni, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/018,684

(22) Filed: Jun. 26, 2018

(65) Prior Publication Data

US 2019/0393231 A1    Dec. 26, 2019

(51) Int. Cl.
| | |
|---|---|
| *H01L 23/52* | (2006.01) |
| *H01L 27/112* | (2006.01) |
| *H01L 23/525* | (2006.01) |
| *H01L 27/02* | (2006.01) |
| *H01L 23/528* | (2006.01) |

(52) U.S. Cl.
CPC ...... *H01L 27/11206* (2013.01); *H01L 23/528* (2013.01); *H01L 23/5256* (2013.01); *H01L 27/0207* (2013.01); *H01L 23/5252* (2013.01)

(58) Field of Classification Search
CPC ......... H01L 2924/0002; H01L 2924/00; H01L 23/5252; H01L 27/101; H01L 27/11206; H01L 27/0207; H01L 23/5256; H01L 23/528

See application file for complete search history.

(56) References Cited

U.S. PATENT DOCUMENTS

| | | | | |
|---|---|---|---|---|
| 6,096,580 A | * | 8/2000 | Iyer | H01L 23/5252 257/E23.147 |
| 6,141,245 A | * | 10/2000 | Bertin | G11C 17/16 257/E25.013 |
| 8,213,211 B2 | * | 7/2012 | Kurjanowicz | G11C 17/18 365/100 |
| 2004/0004268 A1 | * | 1/2004 | Brown | H01L 23/5252 257/529 |
| 2005/0237797 A1 | * | 10/2005 | Jeng | G11C 16/0475 365/185.01 |
| 2006/0226509 A1 | * | 10/2006 | Min | H01L 23/5252 257/530 |
| 2006/0227588 A1 | * | 10/2006 | Ogawa | G11C 29/808 365/78 |
| 2006/0244099 A1 | * | 11/2006 | Kurjanowicz | G11C 17/16 257/530 |
| 2007/0257331 A1 | * | 11/2007 | Kurjanowicz | H01L 27/11206 257/530 |
| 2008/0315354 A1 | * | 12/2008 | Ahn | H01L 23/5256 257/529 |

(Continued)

*Primary Examiner* — Mohammed Shamsuzzaman
(74) *Attorney, Agent, or Firm* — Fletcher Yoder, P.C.

(57) ABSTRACT

A device includes a fuse-array mat including a plurality of fuse-array elements. Each fuse-array element includes a fuse comprising a fuse line having less than or equal to 50% of a dimension of the fuse line disposed over an active area of the fuse-array element, wherein the fuse is configured to be activated to indicate a fuse state of the fuse of two possible fuse states of the fuse. Additionally, each fuse-array element includes an access device comprising a gate line having more than 50% of a dimension of the gate line disposed over the active area of the fuse-array element.

18 Claims, 4 Drawing Sheets

(56) References Cited

U.S. PATENT DOCUMENTS

| | | | |
|---|---|---|---|
| 2009/0179690 A1* | 7/2009 | Kim | G11C 17/16 327/525 |
| 2010/0109066 A1* | 5/2010 | Liu | G11C 16/0408 257/315 |
| 2010/0165774 A1* | 7/2010 | Lee | G11C 17/16 365/225.7 |
| 2010/0220511 A1* | 9/2010 | Kurjanowicz | H01L 27/101 365/96 |
| 2012/0081942 A1* | 4/2012 | Kurjanowicz | G11C 29/027 365/94 |
| 2013/0059238 A1* | 3/2013 | Kurjanowicz | H01L 27/112 430/5 |
| 2013/0308365 A1* | 11/2013 | Smith | G11C 17/18 365/96 |
| 2014/0071779 A1* | 3/2014 | Son | G11C 17/16 365/225.7 |
| 2014/0098623 A1* | 4/2014 | Sforzin | G11C 17/16 365/225.7 |
| 2014/0209989 A1* | 7/2014 | Kurjanowicz | G11C 17/16 257/314 |
| 2015/0380102 A1* | 12/2015 | Choi | G11C 17/16 365/51 |
| 2017/0207228 A1* | 7/2017 | Chen | G11C 16/12 |
| 2017/0287721 A1* | 10/2017 | Wood | H01L 29/66272 |
| 2018/0053767 A1* | 2/2018 | Cheng | H01L 27/1052 |
| 2018/0197875 A1* | 7/2018 | Hsu | G11C 7/04 |
| 2019/0131238 A1* | 5/2019 | Chang | H01L 23/5252 |
| 2019/0164981 A1* | 5/2019 | Chen | G11C 11/5621 |
| 2019/0165045 A1* | 5/2019 | Chung | H01L 27/2454 |
| 2019/0251223 A1* | 8/2019 | Chang | G06F 17/5072 |
| 2019/0267389 A1* | 8/2019 | Choi, II | H01L 27/11524 |

* cited by examiner

FUSE-ARRAY ELEMENT

BACKGROUND

Field of the Present Disclosure

The present disclosure relates to circuitry for electronic devices, and more specifically, to systems and methods for improving fuse-array systems of electronic devices through the use of particular fuse-array elements.

Description of Related Art

One-time programmable (OTP) memories may be implemented, for example, in electronic devices and/or on a physical die to be utilized in conjunction with a chip, processor, programmable logic device, application specific integrated circuit, or the like. OTP memory may generally be utilized as permanent storage and may store, for example, programs, boot code (e.g., instructions are run by a computer or an electronic device at start up), device identification information, and/or other information to be fixed in value.

OTP memory may utilize fuses to ensure that bits of the OTP memory remain fixed (e.g., cannot be altered). The fixing of bits of the OTP memory may be accomplished via the blowing of a fuse or the unblowing of an anti-fuse, depending the type of OTP memory utilized. When a fuse is utilized in the OTP memory, it is initially in an unblown state characterized by a relatively low resistance. Application of a high current (e.g., above a predetermined level) causes a permanent transition of the fuse to a blown state characterized by a relatively high resistance (i.e., effectively generating an open circuit). Conversely, when an anti-fuse is utilized in the OTP memory, it is initially in a blown state and application of a high voltage (e.g., above a predetermined level) causes a permanent transition of the anti-fuse to an unblown state (i.e., effectively generating a closed circuit). A blown state may correspond to a logical low value (e.g., 0) and an unblown state may correspond to a logical high value (e.g., 1) or vice versa.

OTP memory (e.g., OTP memory arrays) may use large amounts of physical space on a die or in a device (e.g., in an integrated circuit). For example, as die areas continue to shrink, and as memory densities increase, the footprint of the OTP memory arrays may operate as a constraint on device size.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

One-time programmable (OTP) memories may be implemented, for example, in electronic devices and/or on a physical die to be utilized in conjunction with a chip, processor, programmable logic device, application specific integrated circuit, or the like as permanent storage and the OTP memories may utilize a fuse-array mat (e.g., a physical array of fuse-array elements each inclusive of a fuse and a respective access device) to store information (e.g., bits) in the OTP memory. In one embodiment, the fuse-array elements may include discrete (e.g., physically separate) access devices and fuses. In another embodiment, the design of the fuse-array element may be altered such that the access device and the fuse of the fuse-array element of a fuse-array mat are merged to form a compact unit, which, for example, may be arrayed in a staggered fashion. This may provide for compact layout footprints and, accordingly, reduced fuse-array element sizes, which results in reductions in the footprint of fuse-array mats.

Figure 1:
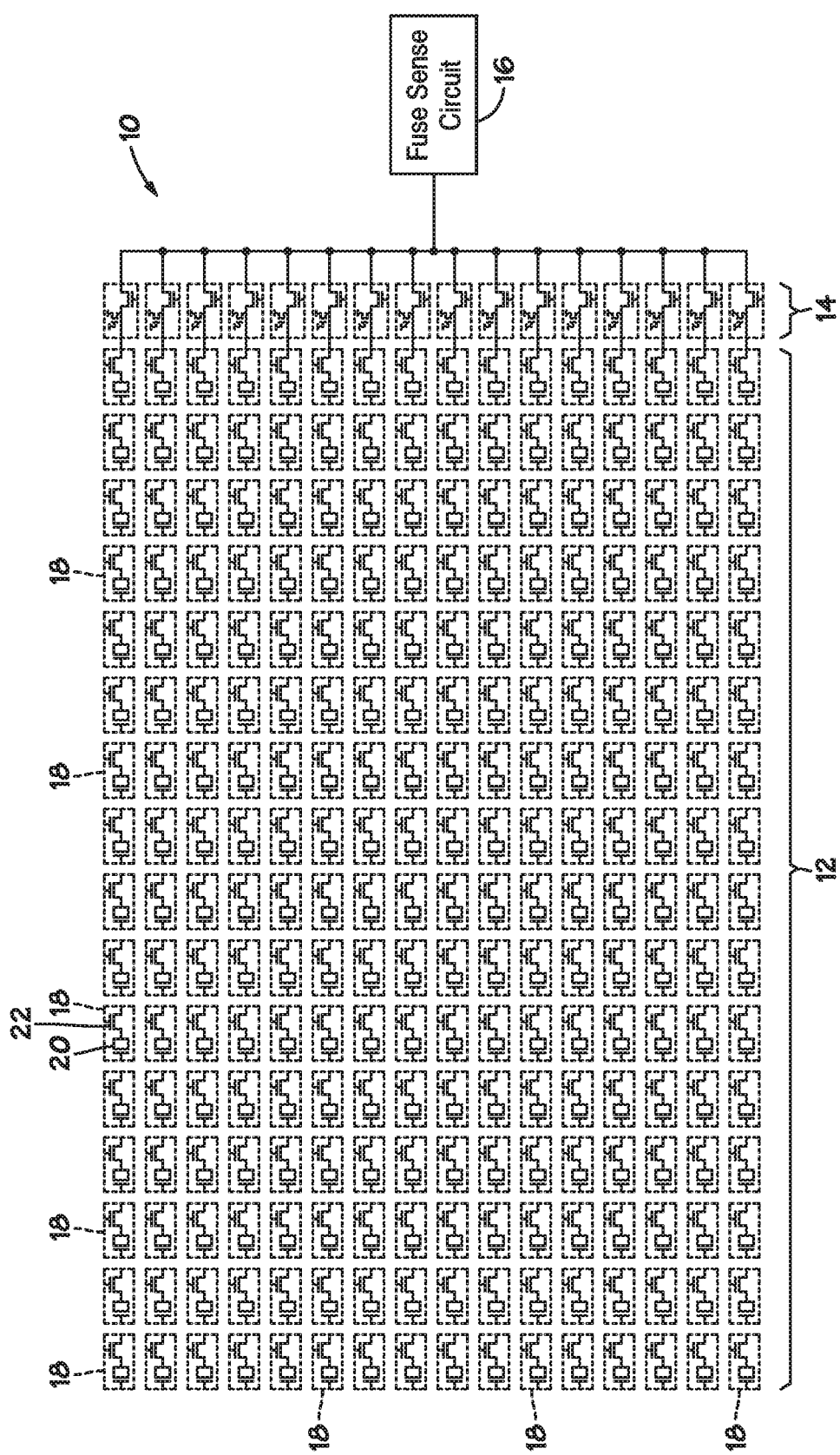
FIG. 1 illustrates a block diagram of a fuse-array system, in accordance with an embodiment.

Turning to the figures, FIG. 1 illustrates a schematic diagram of a fuse-array system 10. The fuse-array system 10 may be part of, for example, an OTP memory that may be implemented, for example, on a die as part of an integrated circuit. The fuse-array system 10 may include a fuse-array mat 12, address circuitry 14, and a fuse sense circuit 16. The fuse-array mat 12 may be a physical array of a grouping of fuse-array elements 18. In some embodiments, the fuse-array mat 12 may include 256 fuse-array elements 18 organized into an array having sixteen rows and sixteen columns, however, other array sizes other than that illustrated may be utilized for the fuse-array mat 12.

Each fuse-array element 18 includes a fuse 20 and an access device 22. The 20 may be any one-time programmable memory element, such as a polyfuse, (e.g., polysilicon line polyfuse or sliced polysilicon line polyfuse) and in some embodiments, the fuse 20 may be a single gateox metal-oxide-semiconductor field-effect transistor (MOSFET). Each fuse 20 may be initially in a low resistance state (e.g., an unblown state) and may subsequently be programmed into a high resistance state (e.g., a blown state) in response to application of a voltage or current above a predetermined level. Alternatively, anti-fuses may be utilized in place of fuse 20 and may be programmed to an unblown state.

Each fuse-array element 18 may have the resistance of the fuse 20 therein sensed. Sensing of a resistance (e.g., accessing of a blown state or fuse state) of a particular fuse 20 may be accomplished via the access device 22, which may be a transistor or another type of switch, in conjunction with a signal transmitted from the address circuitry 14. The address circuitry may transmit a control signal that operates to select a particular row of the fuse-array mat 12 and activation of the access device 22 may select a particular fuse-array element 18 of a column of the fuse-array mat 12 to be sensed. The fuse state (e.g., blown or unblown) of the fuse 20 of the selected fuse-array element 18 may be sensed and transmitted to the fuse sense circuit 16, for example, as a voltage value. In some embodiments, the fuse sense circuit 16 may generate an output signal indicative of the fuse state of the selected fuse 20 based upon, for example, the received voltage value (e.g., through a comparison of the received voltage value against a threshold value).

Figure 2:
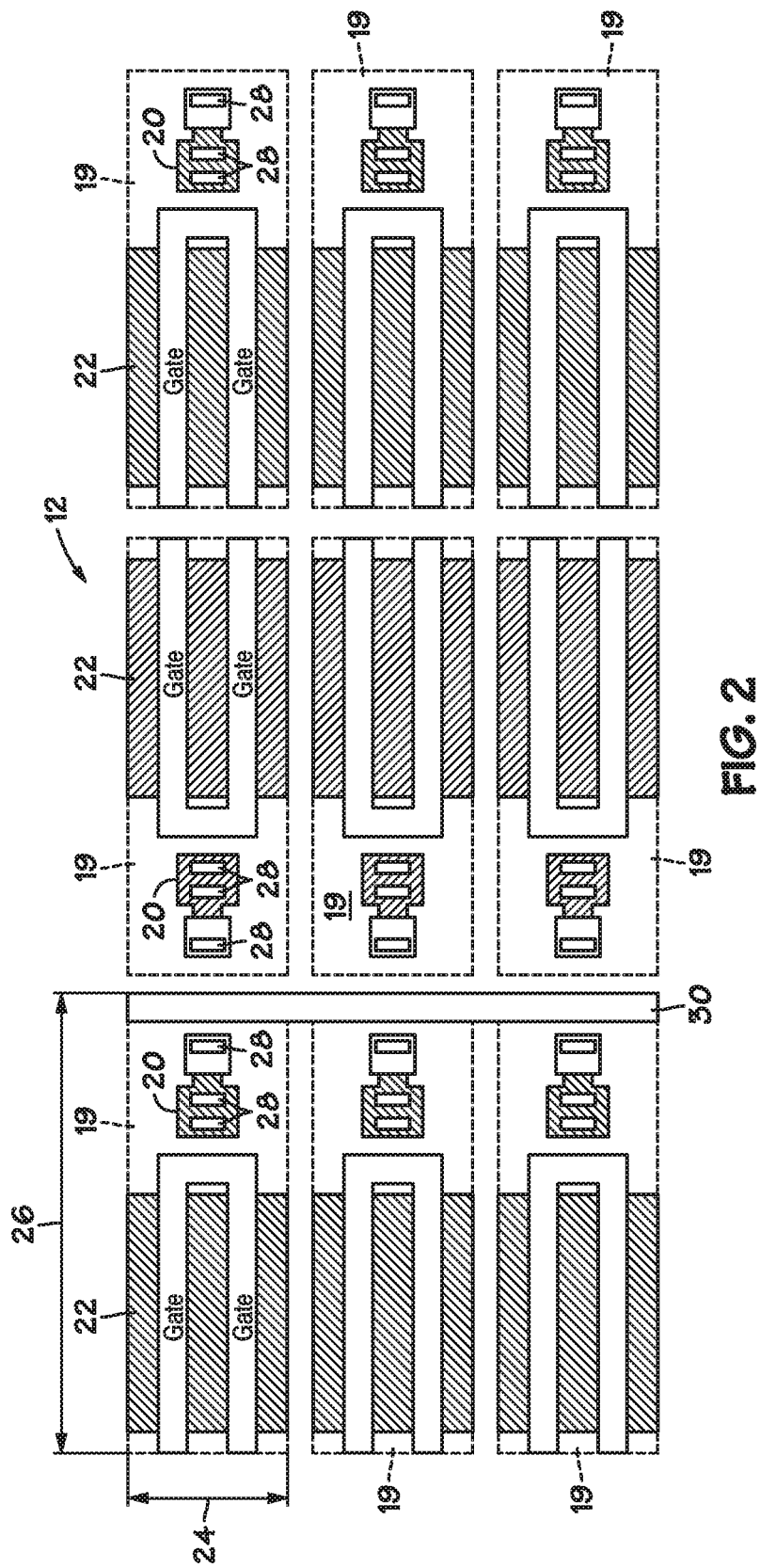
FIG. 2 illustrates a diagram of a first embodiment of fuse-array elements usable in the fuse-array mat of FIG. 1, in accordance with an embodiment.

FIG. 2 illustrates a portion of the fuse-array mat 12 inclusive of a first embodiment of fuse-array elements 19 having a first layout (e.g., fuse-array elements 19 illustrate a first embodiment of the fuse-array elements 18 of FIG. 1). As illustrated, the fuse-array elements 19 have a height 24 and a width 26 that results in an overall footprint in area of, for example, approximately 1.5 microns $(\mu)^2$. Furthermore, each fuse-array element 18 includes an internal layout whereby the fuse 20 (illustrated as a stub fuse or a finger fuse having one or more taps 28, such as metal contacts, that allow for local interconnections to the fuse 20) is discrete e.g., physically separated from) the access device 22. Additionally, one or more plugs 30 may be included in the layout to provide isolation between adjacently aligned fuses 20, which may additionally contribute to an increased footprint of the fuse-array mat 12.

Figure 3:
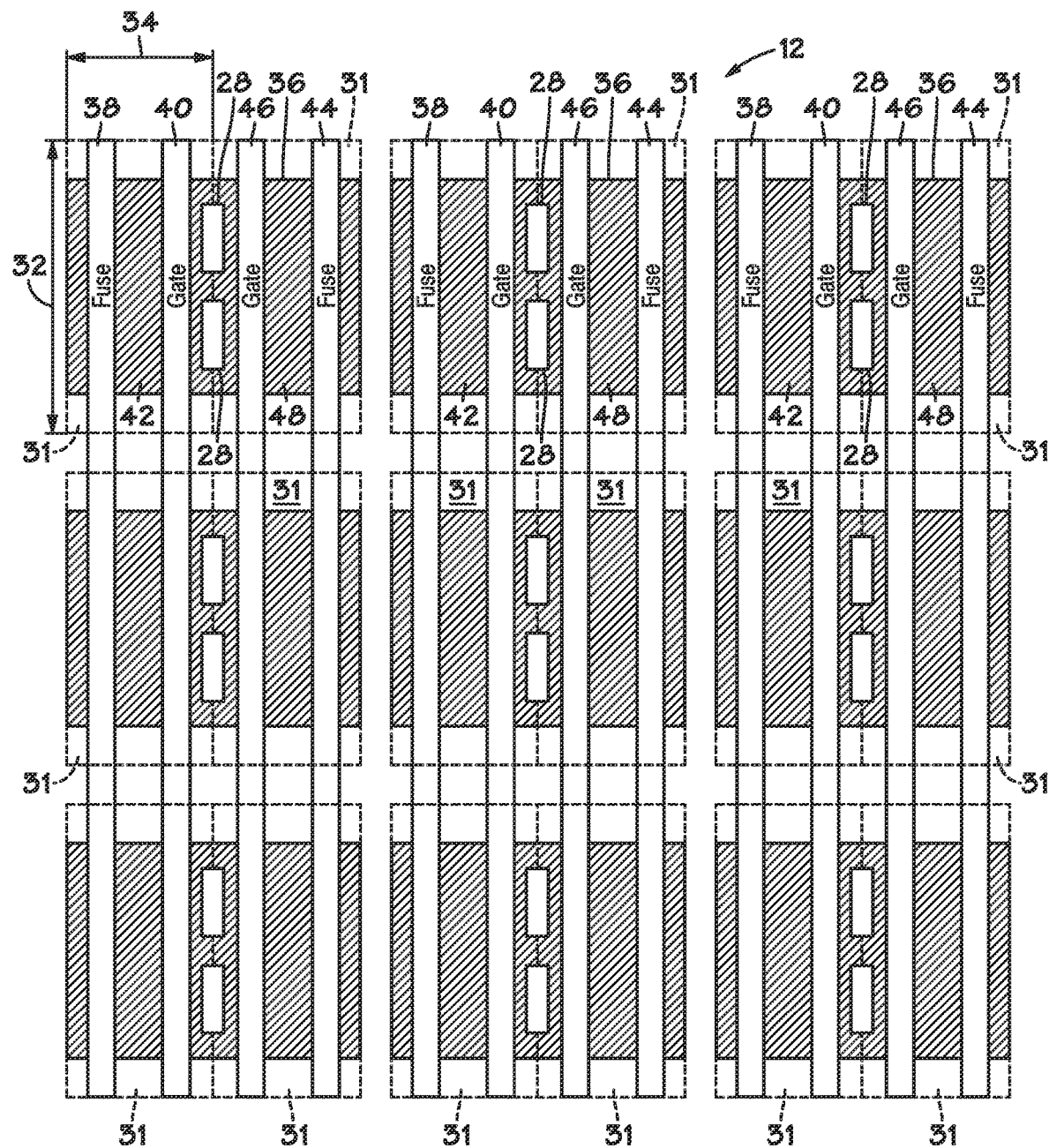
FIG. 3 illustrates a diagram of a second embodiment of fuse-array elements usable in the fuse-array mat of FIG. 1, in accordance with an embodiment.

In an effort to reduce the footprint (e.g., physical size) of the fuse-array mat 12, FIG. 3 illustrates a portion of the fuse-array mat 12 inclusive of a second embodiment of fuse-array elements 31 having a second layout (e.g., fuse-array elements 31 illustrate a second embodiment of the fuse-array elements 18 of FIG. 1). As illustrated, the fuse-array elements 31 have a height 32 and a width 34 that results in an overall footprint in area of, for example, approximately $0.6\mu^2$. As illustrated, two adjacent fuse-array elements 31 may be disposed over a common active area 36 having four sides, a top, and a bottom, such that a first fuse 20 (a portion of which is illustrated by, for example, fuse line 38 and a portion of the common active area 36 disposed below the fuse line 38) and a first access device 22 (a portion of which is illustrated by, for example, gate line 40 and a portion of the common active area 36 disposed below the gate line 40) are disposed in a first portion 42 of the common active area 36 as portions of a first fuse-array element 31 and a second fuse 20 (a portion of which is illustrated by, for example, fuse line 44 and a portion of the common active area 36 disposed below the fuse line 44) and a second access device 22 (a portion of which is illustrated by, for example, gate line 46 and a portion of the common active area 36 disposed below the gate line 46) are disposed in a second portion 48 of the common active area 36 as portions of a second fuse-array element 31 adjacent to the illustrated first fuse-array element 31. Additionally, the adjacent fuse-array elements 31 share the one or more taps 28 which, as illustrated, may be disposed in both of the first portion 42 of the common active area 36 and the second portion 48 of the common active area 36 (e.g., the one or more taps 28 may be partially disposed in each of the illustrated two adjacent fuse-array elements 31).

Figure 4:
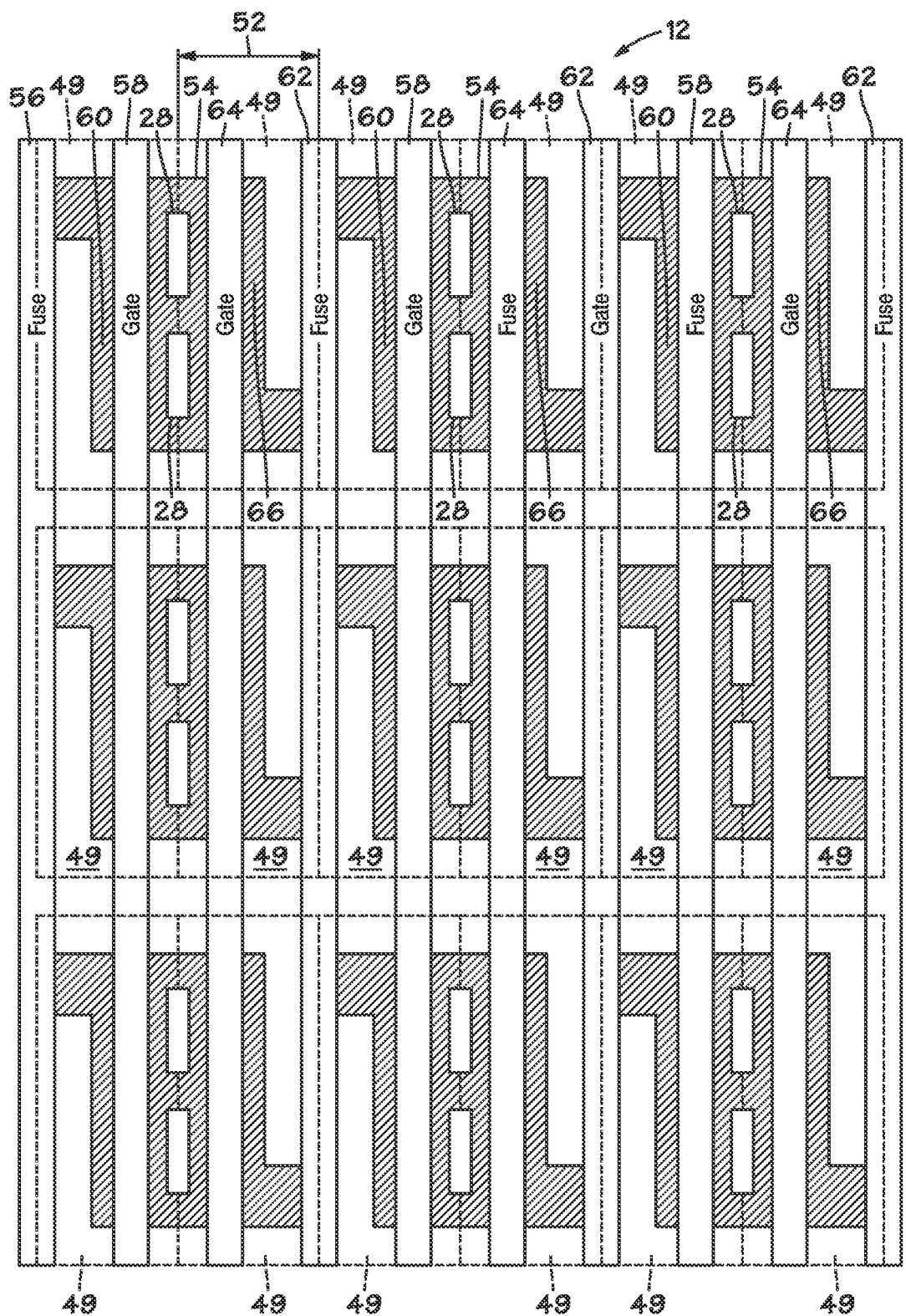
FIG. 4 illustrates a diagram of a third embodiment of fuse-array elements usable in the fuse-array mat of FIG. 1, in accordance with an embodiment.

While the fuse-array elements 31 result in a reduced overall footprint in area relative to the fuse-array elements 18 (and, accordingly, a reduced footprint of the fuse-array mat 12), in some embodiments, it may be desirable to reduce the footprint of the fuse-array elements 31 and, thereby, their associated fuse-array mat 12. FIG. 4 illustrates an example of portion of a fuse-array mat 12 having a reduced footprint relative to the fuse-array mat 12 illustrated in each of FIGS. 2 and 3.

FIG. 4 illustrates a portion of the fuse-array mat 12 inclusive of a third embodiment of fuse-array elements 49 having a third layout (e.g., fuse-array elements 49 illustrate a third embodiment of the fuse-array elements 18 of FIG. 1). As illustrated, the fuse-array elements 49 have a height 50 and a width 52 that results in an overall footprint in area of, for example, less than approximately $0.4\mu^2$, or, less than approximately $0.25\mu^2$ in some embodiment, a smaller area. As illustrated, two adjacent fuse-array elements 49 may be disposed over a common active area 54 such that a first fuse 20 (a portion of which is illustrated by, for example, fuse line 56 and a portion of the common active area 54 disposed below the fuse line 56) and a first access device 22 (a portion of which is illustrated by, for example, gate line 58 and a portion of the common active area 54 disposed below the gate line 58) are disposed in a first portion 60 of the common active area 54 as portions of a first fuse-array element 49 and a second fuse 20 (a portion of which is illustrated by, for example, fuse line 62 and a portion of the common active area 54 disposed below the fuse line 62) and a second access device 22 (a portion of which is illustrated by, for example, gate line 64 and a portion of the common active area 54 disposed below the gate line 64) are disposed in a second portion 66 of the common active area 54 as portions of a second fuse-array element 49 adjacent to the illustrated first fuse-array element 49. Additionally, the adjacent fuse-array elements 49 share the one or more taps 28 which, as illustrated, may be disposed in both of the first portion 60 of the common active area 54 and the second portion 66 of the common active area 54 (e.g., the one or more taps 28 may be partially disposed in each of the illustrated two adjacent fuse-array elements 31).

As illustrated in previously discussed FIG. 3, each fuse 20 and access device 22 for each fuse-array element 31 are merged into the common active area 36 such that in at least one dimension (e.g., a height of the fuse lines 38 and 44 measured along the height 32 of the fuse-array elements 31) more than at least approximately, 50%, 75%, 80%, or greater of the total length of the respective fuse line 38 and 44 is disposed over portions of the common active area 36). As an alternative, as illustrated in FIG. 4, a common active area is sized and arranged such that in at least one dimension (e.g., a height of the fuse lines 56 and 62 measured along the height 50 of the fuse-array elements 49) less than or equal to at least approximately, 50%, 25%, 20%, or less of the total height of the respective fuse line 56 and 62 is disposed over portions of the common active area 54. That is, FIG. 4 illustrates merger of the fuse 20 (e.g., having a stub fuse design) with access device 22 in a staggered way, such that the fuse 20 and access device 22 of each of the fuse-array elements 49 are stacked in a pattern. In some embodiments, this pattern may be an offset pattern whereby the fuse lines 56 and 62 for adjacent fuse-array elements 49 are partially disposed (e.g., having less that an approximately 50%, 25%, 20%, or less of the fuse lines 56 and 62 in one dimension disposed over portions of the common active area 54) so as to stack the fuse-array elements 49 (e.g., whereby fuse line 56 is disposed over a portion of the common active area 54 in an upper portion of a first fuse-array element 49 and fuse line 62 is disposed over a portion of the common active area 54 in a lower portion of a second fuse-array element 49 that is adjacent to the first fuse-array element 49 as the pattern for the stacked fuse-array elements 49).

In some embodiments, the fuse lines 56 and 62 for adjacent fuse-array elements 49 are partially disposed over portions of the common active area 54 (e.g., having less than an approximately 50%, 25%, 20%, or less of the fuse lines 56 and 62 in one dimension disposed over portions of the common active area 54) relative to the gate lines 58 and 64 for the adjacent fuse-array elements 49, which may be regarded as being fully disposed over portions of the common active area 54 (e.g., having more that an approximately 50%, 75%, 80%, or more of the gate lines 58 and 64 in one dimension disposed over portions of the common active area 54, whereby the dimension of the gate lines 58 and 64 is the same dimension as the dimension of the fuse lines 56 and 62 or is parallel to the dimension of the fuse lines 56 and 62). A third fuse-array element 49 that is adjacent to the second fuse-array element 49 may include a common active area 54 patterned in a manner similar to the first fuse-array element 49 and a fourth fuse-array element 49 that is adjacent to the third fuse-array element 49 may include a common active area 54 patterned in a manner similar to the second fuse-array element 49.

In the illustrated embodiment of FIG. 4, the first portion 60 of the common active area 54 comprises a width having a value an upper region of the fuse-array element 49 (e.g., at a first location along the height 50 of the fuse-array element 49) that is greater than the value of the width at a second location (e.g., in either or both of a middle and lower region of the fuse-array element 49) along the height 50 of the fuse-array element 49. Likewise, the second portion 66 of the common active area 54 comprises a width having a value a lower region of the fuse-array element 49 (e.g., at a location along the height 50 of the fuse-array element 49) that is greater than the value of the width at a second location (e.g., in either or both of a middle and an upper region of the fuse-array element 49) along the height 50 of the fuse-array element 49. Additionally, the greater widths in the first portion 60 of the common active area 54 and in the second portion 66 of the common active area 54 may have the same value, such that the pattern of the common active area 54 is generally an inverted "S" shape (although other patterns are envisioned as well).

As illustrated in FIG. 4, the common active area 54 of the fuse-array elements 49 may be patterned so that it forms a shape having more than four sides, a top, and a bottom. For example, the common active area 54 of the fuse-array elements 49 has eight sides, a top, and a bottom. However, it is envisioned that other patterns having more than four sides, a top, and a bottom may be employed when generating the shape of the common active area 54 of the fuse-array elements 49. It may be appreciated that selection of the pattern shape for the common active area 54 of the fuse-array elements 49 may be chosen to allow for stacking of the fuse-array elements 49 (e.g., will allow for the placing the fuse-array elements 49 in close proximity to one another whereby the selected shape of the common active area 54 of the fuse-array elements 49 determines the height 50 and a width 52 of the fuse-array elements 49 and, therefore, the overall footprint in area of the fuse-array elements 49). In some embodiments, the shape of the fuse-array elements 49 may be chosen so that the overall footprint in area of the fuse-array elements 49 is less than each of the overall footprint in area of the fuse-array elements 19 of FIG. 2 and the overall footprint in area of the fuse-array elements 39 of FIG. 3.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
  a fuse-array mat comprising a plurality of fuse-array elements arranged in a first direction and a second direction, wherein the first and the second direction are perpendicular to each other, wherein each fuse-array element of the plurality of fuse-array elements comprises:
  a fuse comprising a fuse line having less than or equal to 50% of a dimension of the fuse line disposed over an active area of the fuse-array element, wherein the fuse is configured to be activated to indicate a fuse state of the fuse of two possible fuse states of the fuse, wherein the dimension of the fuse line is measured along a height of the fuse-array element wherein the height is in the first direction; and
  an access device comprising a gate line having more than 50% of a dimension of the gate line disposed over the active area of the fuse-array element, wherein the dimension of the gate line is measured along the height of the fuse-array element, wherein one or more taps are partially disposed in each of two adjacent fuse-array elements of the plurality of the fuse-array elements.

2. The device of claim 1, wherein the dimension of the fuse line is parallel to a dimension of the fuse-array element comprising the height of the fuse-array element.

3. The device of claim 2, wherein the dimension of the gate line is parallel to the dimension of the fuse-array element comprising the height of the fuse-array element.

4. The device of claim 1, wherein the fuse comprises a stub fuse.

5. The device of claim 1, wherein the fuse line comprises less than or equal to 25% of the dimension of the fuse line disposed over the active area of the fuse-array element.

6. The device of claim 1, wherein the fuse line comprises less than or equal to 20% of the dimension of the fuse line disposed over the active area of the fuse-array element.

7. The device of claim 6, wherein the gate line comprises more than 75% of the dimension of the gate line disposed over the active area of the fuse-array element.

8. A device, comprising:
  a plurality of fuse-array elements arranged in a first direction and second direction, wherein the first and the second direction are perpendicular to each other, wherein each fuse-array element of the plurality of fuse-array elements comprises:
    an active area comprising more than four sides exclusive of a top and a bottom, wherein the active area comprises a first portion of the active area and a second portion of the active area;

a first fuse-array element comprising the first portion of the active area, wherein the first fuse-array element comprises:
  a fuse configured to be activated to indicate a fuse state of the fuse of two possible fuse states of the fuse, wherein the fuse comprises a fuse line having less than or equal to 50% of a dimension of the fuse line disposed over the first portion of the active area, wherein the dimension of the fuse line is measured along a height of the fuse line, wherein the height is in the first direction; and
  an access device configured to access the fuse state of the fuse, wherein the access device comprises a gate line having more than 50% of a dimension of the gate line disposed over the second portion of the active area, wherein the dimension of the gate line is measured along the height of the gate line; and
one or more taps partially disposed in each of two adjacent fuse-array elements of the plurality of the fuse-array elements.

9. The device of claim 8, wherein the height of the fuse line has a same value as a height of the first fuse-array element.

10. The device of claim 9, wherein the first portion of the active area comprises a first width having a first value at a first location along the height of the first fuse-array element and a second width having a second value at a second location along the height of the first fuse-array element.

11. The device of claim 10, wherein the first width of the first portion of the active area having the value is less than the second width of the first portion of the active area having the second value.

12. The device of claim 10, wherein the first location along the height of the first fuse-array element is disposed at an upper region of the first portion of the active area and the second location along the height of the first fuse-array element is disposed at a lower region of the first portion of the active area.

13. The device of claim 8, comprising a second fuse-array element comprising the second portion of the active area, wherein the second fuse-array element comprises:
  a second fuse configured to be activated to indicate a fuse state of the second fuse of two possible fuse states of the second fuse; and
  a second access device configured to access the fuse state of the second fuse.

14. The device of claim 13, wherein the second fuse comprises a second fuse line having less than or equal to 50% of a dimension of the second fuse line disposed over the second portion of the active area.

15. The device of claim 13, wherein the second portion of the active area comprises a first width having a first value at a first location along a height of the second fuse-array element and a second width at a second location along the height of the second fuse-array element, wherein the second width comprises a second value that is less than the first value.

16. The device of claim 15, wherein the first location along the height of the second fuse-array element is disposed at a lower region of the second portion of the active area and the second location along the height of the second fuse-array element is disposed at an upper region of the second portion of the active area.

17. A system, comprising:
  a fuse-array mat, comprising:
    a plurality of fuse-array elements arranged in a first direction and a second direction, wherein the first and the second direction are perpendicular to each other, wherein each fuse-array element of the plurality of fuse-array elements comprises:
      a fuse comprising a fuse line having less than or equal to 50% of a dimension of the fuse line disposed over a first portion of an active area of the fuse-array element, wherein the active area of the fuse-array element comprises more than four sides, wherein the dimension of the fuse line is measured along a height of the fuse-array element, wherein the height is in the first direction; and
      an access device comprising a gate line having more than 50% of a dimension of the gate line disposed over a second portion of the active area of the fuse-array element, wherein the dimension of the gate line is measured along the height of the fuse-array element; and
    one or more taps partially disposed in each of two adjacent fuse-array elements of the plurality of the fuse-array elements.

18. The system of claim 17, wherein the active area of the fuse-array comprises a first width in an upper region of the active area and in a lower region of the active area and comprises a second width in a third region disposed between the upper region of the active area and the lower region of the active area.

* * * * *